United States Patent
Zhao et al.

(10) Patent No.: US 10,381,493 B2
(45) Date of Patent: Aug. 13, 2019

(54) SOLAR CELL UNIT, SOLAR CELL ARRAY, SOLAR CELL MODULE AND MANUFACTURING METHOD THEREOF

(71) Applicant: BYD COMPANY LIMITED, Shenzhen (CN)

(72) Inventors: Zhiqiang Zhao, Shenzhen (CN); Ye Tian, Shenzhen (CN); Liguo Wang, Shenzhen (CN); Shengya Wang, Shenzhen (CN); Zhanfeng Jiang, Shenzhen (CN); Long He, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 14/738,677

(22) Filed: Jun. 12, 2015

(65) Prior Publication Data
US 2016/0126364 A1    May 5, 2016

(30) Foreign Application Priority Data

Oct. 31, 2014 (CN) .......................... 2014 1 0606601
Oct. 31, 2014 (CN) .......................... 2014 1 0606607
(Continued)

(51) Int. Cl.
*H01L 31/0224*   (2006.01)
*H01L 31/05*     (2014.01)
(Continued)

(52) U.S. Cl.
CPC .. *H01L 31/02013* (2013.01); *H01L 31/02008* (2013.01); *H01L 31/022433* (2013.01);
(Continued)

(58) Field of Classification Search
CPC ....... H01L 31/022433; H01L 31/00504; H01L 31/02008; H01L 31/02–02966
(Continued)

(56) References Cited

U.S. PATENT DOCUMENTS 3,620,847 A * 11/1971 Wise ..................... B64G 1/443
                                                    136/244
4,141,727 A    2/1979 Shida et al.
(Continued)

FOREIGN PATENT DOCUMENTS

CN    101919066 A    12/2010
CN    102217088 A    10/2011
(Continued)

OTHER PUBLICATIONS

PV Tech article via http://www.pv-tech.cn/technical_papers/The-front-electrode_of_crystalline_silicon_solar_ . . . / dated Jul. 15, 2014, including English translation, (11p).
(Continued)

*Primary Examiner* — Niki Bakhtiari
(74) *Attorney, Agent, or Firm* — Brinks Gilson & Lione

(57) ABSTRACT

A solar cell unit comprises a cell. The cell includes a cell substrate and a secondary grid line disposed on a front surface of the cell substrate. The solar cell unit also comprises a conductive wire intersecting and welded with the secondary grid line. The secondary grid line has a width in a welding position with the conductive wire greater than a width thereof in a non-welding position.

15 Claims, 7 Drawing Sheets

(30) Foreign Application Priority Data

| Date | Country | Application Number |
|---|---|---|
| Oct. 31, 2014 | (CN) | 2014 1 0606675 |
| Oct. 31, 2014 | (CN) | 2014 1 0606700 |
| Oct. 31, 2014 | (CN) | 2014 1 0608469 |
| Oct. 31, 2014 | (CN) | 2014 1 0608576 |
| Oct. 31, 2014 | (CN) | 2014 1 0608577 |
| Oct. 31, 2014 | (CN) | 2014 1 0608579 |
| Oct. 31, 2014 | (CN) | 2014 1 0608580 |
| Feb. 17, 2015 | (CN) | 2015 1 0085666 |
| Apr. 3, 2015 | (CN) | 2015 1 0217551 |
| Apr. 3, 2015 | (CN) | 2015 1 0217573 |
| Apr. 3, 2015 | (CN) | 2015 1 0217609 |
| Apr. 3, 2015 | (CN) | 2015 1 0217616 |
| Apr. 3, 2015 | (CN) | 2015 1 0217617 |
| Apr. 3, 2015 | (CN) | 2015 1 0217625 |
| Apr. 3, 2015 | (CN) | 2015 1 0217687 |
| Apr. 3, 2015 | (CN) | 2015 1 0218489 |
| Apr. 3, 2015 | (CN) | 2015 1 0218535 |
| Apr. 3, 2015 | (CN) | 2015 1 0218562 |
| Apr. 3, 2015 | (CN) | 2015 1 0218563 |
| Apr. 3, 2015 | (CN) | 2015 1 0218574 |
| Apr. 3, 2015 | (CN) | 2015 1 0218635 |
| Apr. 3, 2015 | (CN) | 2015 1 0218697 |
| Apr. 3, 2015 | (CN) | 2015 1 0219182 |
| Apr. 3, 2015 | (CN) | 2015 1 0219353 |
| Apr. 3, 2015 | (CN) | 2015 1 0219366 |
| Apr. 3, 2015 | (CN) | 2015 1 0219378 |
| Apr. 3, 2015 | (CN) | 2015 1 0219417 |
| Apr. 3, 2015 | (CN) | 2015 1 0219436 |
| Apr. 3, 2015 | (CN) | 2015 1 0219540 |
| Apr. 3, 2015 | (CN) | 2015 1 0219565 |
| Apr. 3, 2015 | (CN) | 2015 1 0221302 |
| Apr. 3, 2015 | (CN) | 2015 2 0276309 |
| Apr. 3, 2015 | (CN) | 2015 2 0276534 |
| Apr. 3, 2015 | (CN) | 2015 2 0277480 |
| Apr. 3, 2015 | (CN) | 2015 2 0278149 |
| Apr. 3, 2015 | (CN) | 2015 2 0278183 |
| Apr. 3, 2015 | (CN) | 2015 2 0278409 |
| Apr. 3, 2015 | (CN) | 2015 2 0280778 |
| Apr. 3, 2015 | (CN) | 2015 2 0280868 |

(51) Int. Cl.
  *H01L 31/02*    (2006.01)
  *H01L 31/048*   (2014.01)
  *H01L 31/18*    (2006.01)
  *H01L 31/049*   (2014.01)

(52) U.S. Cl.
  CPC .......... *H01L 31/048* (2013.01); *H01L 31/049* (2014.12); *H01L 31/0488* (2013.01); *H01L 31/0504* (2013.01); *H01L 31/0508* (2013.01); *H01L 31/18* (2013.01); *Y02E 10/50* (2013.01)

(58) Field of Classification Search
  USPC ................................................ 136/243–265
  See application file for complete search history.

(56) References Cited

U.S. PATENT DOCUMENTS

| | | |
|---|---|---|
| 4,287,382 A | 9/1981 | French |
| 4,336,648 A | 6/1982 | Pschunder et al. |
| 4,574,160 A | 3/1986 | Cull et al. |
| 4,633,034 A | 12/1986 | Nath et al. |
| 5,011,544 A | 4/1991 | Gaddy et al. |
| 5,380,371 A | 1/1995 | Murakami |
| 5,942,048 A | 8/1999 | Fujisaki et al. |
| 6,021,099 A | 2/2000 | Aoki et al. |
| 6,710,239 B2 | 3/2004 | Tanaka |
| 6,870,087 B1* | 3/2005 | Gallagher .................. F24J 2/38 136/244 |
| 7,432,438 B2 | 10/2008 | Rubin et al. |
| 7,534,956 B2 | 5/2009 | Kataoka et al. |
| 8,356,640 B1 | 1/2013 | Nizenkoff et al. |
| 2002/0148499 A1* | 10/2002 | Tanaka ............ H01L 31/022425 136/256 |
| 2004/0084078 A1 | 5/2004 | Yoshida et al. |
| 2004/0182432 A1 | 9/2004 | Yoda et al. |
| 2005/0268959 A1 | 12/2005 | Aschenbrenner et al. |
| 2006/0283496 A1 | 12/2006 | Okamoto et al. |
| 2007/0095387 A1 | 5/2007 | Fuji et al. |
| 2007/0186968 A1* | 8/2007 | Nakauchi ........ H01L 31/022425 136/244 |
| 2007/0209697 A1* | 9/2007 | Karakida ........ H01L 31/022425 136/256 |
| 2008/0083453 A1 | 4/2008 | Rose et al. |
| 2008/0149161 A1 | 6/2008 | Nishida et al. |
| 2009/0038679 A1 | 2/2009 | Varghese et al. |
| 2009/0111206 A1 | 4/2009 | Luch |
| 2009/0120490 A1 | 5/2009 | Huang et al. |
| 2009/0173385 A1 | 7/2009 | Kost et al. |
| 2009/0242013 A1* | 10/2009 | Taguchi .......... H01L 31/022425 136/246 |
| 2009/0283137 A1 | 11/2009 | Croft et al. |
| 2010/0000602 A1 | 1/2010 | Gray et al. |
| 2010/0043863 A1 | 2/2010 | Wudu et al. |
| 2010/0043871 A1 | 2/2010 | Xia et al. |
| 2010/0055822 A1 | 3/2010 | Weidman et al. |
| 2010/0065116 A1 | 3/2010 | Stancel et al. |
| 2010/0089447 A1 | 5/2010 | Basol et al. |
| 2010/0139753 A1 | 6/2010 | Repmann et al. |
| 2010/0275976 A1 | 11/2010 | Rubin et al. |
| 2011/0023958 A1 | 2/2011 | Masson et al. |
| 2011/0036390 A1 | 2/2011 | Nelson et al. |
| 2011/0048492 A1 | 3/2011 | Nishiwaki |
| 2011/0290298 A1 | 12/2011 | Krause et al. |
| 2012/0060894 A1 | 3/2012 | Nakauchi et al. |
| 2012/0125393 A1 | 5/2012 | Austin |
| 2012/0138141 A1* | 6/2012 | Kim ................ H01L 31/022433 136/256 |
| 2012/0192932 A1 | 8/2012 | Wu et al. |
| 2012/0234379 A1 | 9/2012 | Takenaka |
| 2012/0253541 A1 | 10/2012 | Arditi et al. |
| 2013/0074902 A1 | 3/2013 | Taira et al. |
| 2013/0269748 A1 | 10/2013 | Wiedeman et al. |
| 2014/0048752 A1 | 2/2014 | Akimoto |
| 2014/0182651 A1* | 7/2014 | Rogerson ......... H01L 31/02013 136/244 |
| 2016/0005905 A1 | 1/2016 | Jang et al. |

FOREIGN PATENT DOCUMENTS

| | | |
|---|---|---|
| CN | 102237425 A | 11/2011 |
| CN | 202434543 U | 9/2012 |
| CN | 202678326 U | 1/2013 |
| CN | 202721137 U | 2/2013 |
| CN | 202839628 U | 3/2013 |
| CN | 203221719 U | 10/2013 |
| CN | 103489931 A | 1/2014 |
| CN | 203746873 U | 7/2014 |
| CN | 104037265 A | 9/2014 |
| CN | 203932074 U | 11/2014 |
| CN | 204243052 U | 4/2015 |
| CN | 104752556 A | 7/2015 |
| JP | 1986085876 A | 9/1984 |
| JP | 2004146464 A | 5/2004 |
| JP | 2004288677 A | 10/2004 |
| JP | 2005191319 A | 7/2005 |
| JP | 2011009392 A | 1/2011 |
| JP | 2012028806 A | 2/2012 |
| JP | 2012509588 A | 4/2012 |
| JP | 2013058747 A | 3/2013 |
| JP | 2013065588 A | 4/2013 |
| JP | WO 2014/045909 A1 | 3/2014 |

(56) References Cited

FOREIGN PATENT DOCUMENTS

| JP | 2014103301 A | 6/2014 |
|---|---|---|
| WO | WO 2008/138950 | 11/2008 |
| WO | WO 2015101252 A1 | 7/2015 |

OTHER PUBLICATIONS

Honsberg et al., "Series Resistance," accessed at http://web.archive.org/web/20121214003528/http://pveducation.org/design/series-resistance>, published online as early as Dec. 14, 2014.
Braun, Stefan et al., "*The Multi-Busbar Design: an Overview*," 4$^{th}$ Metallization Workshop, May 8, 2013, Konstanz, 30 pages.
Schindler, Sebastian, "*Soldering Process and Material Characterization and Miniaturized Contact Structures of a Newly Developed Multi Busbar Cell Metallization Concept*," 28$^{th}$ European Photovoltaic Solar Energy Conference and Exhibition, (2006), pp. 480-483.
Stietka, Michael et al., "*Wire Cell: A More Efficient Silicon Solar Cell and Module*," European Photovoltaic Solar Energy Conference, Valencia, Spain, Sep. 2008, as paper ICV.2.33, pp. 1-5.
Walter, Johann et al., "*Multi-Wire Interconnection of Busbar-Free Solar Cells*," ScienceDirect, Energy Procedia vol. 55, (2014), pp. 380-388.

\* cited by examiner

SOLAR CELL UNIT, SOLAR CELL ARRAY, SOLAR CELL MODULE AND MANUFACTURING METHOD THEREOF

The present application claims priority to the following 41 Chinese applications, the entireties of all of which are hereby incorporated by reference.

1. Chinese Patent Application No. 201410608576.6, filed Oct. 31, 2014;
2. Chinese Patent Application No. 201410606607.4, filed Oct. 31, 2014;
3. Chinese Patent Application No. 201410606601.7, filed Oct. 31, 2014;
4. Chinese Patent Application No. 201410606675.0, filed Oct. 31, 2014;
5. Chinese Patent Application No. 201410608579.X, filed Oct. 31, 2014;
6. Chinese Patent Application No. 201410608577.0, filed Oct. 31, 2014;
7. Chinese Patent Application No. 201410608580.2, filed Oct. 31, 2014;
8. Chinese Patent Application No. 201410606700.5, filed Oct. 31, 2014;
9. Chinese Patent Application No. 201410608469.3, filed Oct. 31, 2014;
10. Chinese Patent Application No. 201510085666.6, filed Feb. 17, 2015;
11. Chinese Patent Application No. 201510217625.8, filed Apr. 30, 2015;
12. Chinese Patent Application No. 201510217609.9, filed Apr. 30, 2015;
13. Chinese Patent Application No. 201520276309.3, filed Apr. 30, 2015;
14. Chinese Patent Application No. 201510217687.9, filed Apr. 30, 2015;
15. Chinese Patent Application No. 201510219182.6, filed Apr. 30, 2015;
16. Chinese Patent Application No. 201510217617.3, filed Apr. 30, 2015;
17. Chinese Patent Application No. 201520278183.3, filed Apr. 30, 2015;
18. Chinese Patent Application No. 201510217573.4, filed Apr. 30, 2015;
19. Chinese Patent Application No. 201510219540.3, filed Apr. 30, 2015;
20. Chinese Patent Application No. 201510218489.4, filed Apr. 30, 2015;
21. Chinese Patent Application No. 201510218563.2, filed Apr. 30, 2015;
22. Chinese Patent Application No. 201510219565.3, filed Apr. 30, 2015;
23. Chinese Patent Application No. 201510219436.4, filed Apr. 30, 2015;
24. Chinese Patent Application No. 201510218635.3, filed Apr. 30, 2015;
25. Chinese Patent Application No. 201520277480.6, filed Apr. 30, 2015;
26. Chinese Patent Application No. 201510219366.2, filed Apr. 30, 2015;
27. Chinese Patent Application No. 201520278409.X, filed Apr. 30, 2015;
28. Chinese Patent Application No. 201510218697.4, filed Apr. 30, 2015;
29. Chinese Patent Application No. 201510219417.1, filed Apr. 30, 2015;
30. Chinese Patent Application No. 201510221302.6, filed Apr. 30, 2015;
31. Chinese Patent Application No. 201510219353.5, filed Apr. 30, 2015;
32. Chinese Patent Application No. 201520280778.2, filed Apr. 30, 2015;
33. Chinese Patent Application No. 201510219378.5, filed Apr. 30, 2015;
34. Chinese Patent Application No. 201520280868.1, filed Apr. 30, 2015;
35. Chinese Patent Application No. 201510218574.0, filed Apr. 30, 2015;
36. Chinese Patent Application No. 201510217616.9, filed Apr. 30, 2015;
37. Chinese Patent Application No. 201520278149.6, filed Apr. 30, 2015;
38. Chinese Patent Application No. 201510218562.8, filed Apr. 30, 2015;
39. Chinese Patent Application No. 201510218535.0, filed Apr. 30, 2015;
40. Chinese Patent Application No. 201510217551.8, filed Apr. 30, 2015; and
41. Chinese Patent Application No. 201520276534.7, filed Apr. 30, 2015.

The present application is relevant to the following 10 U.S. applications, filed concurrently with the present application, the entireties of which are hereby incorporated by reference.

U.S. patent application Ser. No. 14/738,244, entitled "Solar Cell Module And Manufacturing Method Thereof," filed Jun. 12, 2015;

U.S. patent application Ser. No. 14/738,322, entitled "Solar Cell Array, Solar Cell Module And Manufacturing Method Thereof," filed Jun. 12, 2015;

U.S. patent application Ser. No. 14/738,368, entitled "Solar Cell Array, Solar Cell Module And Manufacturing Method Thereof," filed Jun. 12, 2015;

U.S. patent application Ser. No. 14/738,390, entitled "Solar Cell Module And Manufacturing Method Thereof," filed Jun. 12, 2015;

U.S. patent application Ser. No. 14/738,409, entitled "Solar Cell Array, Solar Cell Module And Manufacturing Method Thereof," filed Jun. 12, 2015;

U.S. patent application Ser. No. 14/738,664, entitled "Solar Cell Unit, Solar Cell Array, Solar Cell Module And Manufacturing Method Thereof," filed Jun. 12, 2015;

U.S. patent application Ser. No. 14/738,516, entitled "Solar Cell Unit, Solar Cell Array, Solar Cell Module And Manufacturing Method Thereof," filed Jun. 12, 2015;

U.S. patent application Ser. No. 14/738,578, entitled "Solar Cell Unit, Solar Cell Array, Solar Cell Module And Manufacturing Method Thereof," filed Jun. 12, 2015;

U.S. patent application Ser. No. 14/738,587, entitled "Solar Cell Unit, Solar Cell Array, Solar Cell Module And Manufacturing Method Thereof," filed Jun. 12, 2015; and U.S. patent application Ser. No. 14/738,637, entitled "Method For Manufacturing Solar Cell Module," filed Jun. 12, 2015.

FIELD

The present disclosure relates to the field of solar cells, and more particularly, to solar cell units, solar cell arrays, solar cell modules and manufacturing methods thereof.

BACKGROUND

A solar cell module is one of the most important components of a solar power generation device. Sunlight irradiates onto a cell from its front surface and is converted to electricity within the cell. Primary grid lines and secondary grid lines are disposed on the front surface, and then a welding strip covering and welded on the primary grid lines outputs the current. The welding strip, the primary grid lines and the secondary grid lines cover part of the front surface of the cell, which blocks out part of the sunlight, and the part of sunlight irradiating onto the primary grid lines and the secondary grid lines cannot be converted into electric energy. Thus, the welding strip, the primary grid lines and the secondary grid lines need to be as fine as possible in order for the solar cell module to receive more sunlight. However, the welding strip, the primary grid lines and the secondary grid lines serve to conduct current, and in terms of resistivity, the finer the primary grid lines and the secondary grid lines are, the smaller the conductive cross section area thereof is, which causes greater loss of electricity due to increased resistivity. Therefore, the welding strip, the primary grid lines and the secondary grid lines must be designed to achieve a balance between light blocking and electrical conduction, and to take the cost into consideration.

SUMMARY

In one aspect, a solar cell unit comprises a cell. The cell includes a cell substrate and a secondary grid line disposed on a front surface of the cell substrate. The solar cell unit also comprises a conductive wire intersecting and welded with the secondary grid line. The secondary grid line has a width in a welding position with the conductive wire greater than a width thereof in a non-welding position.

In another aspect, a method for manufacturing a solar cell module comprises providing a cell which includes a cell substrate and a secondary grid line disposed on a front surface of the cell substrate. The method also comprises welding a conductive wire comprising a metal wire with the secondary grid line to obtain a solar cell unit. The secondary grid line has a width in a welding position with the conductive wire greater than a width thereof in a non-welding position. The method further comprises superposing an upper cover plate, a front adhesive layer, the solar cell unit, a back adhesive layer and a back plate in sequence. A front surface of the cell faces the front adhesive layer. A back surface thereof faces the back adhesive layer. The method also comprises laminating the superposed layers to obtain the solar cell module.

REFERENCE NUMERALS

Figure 1:
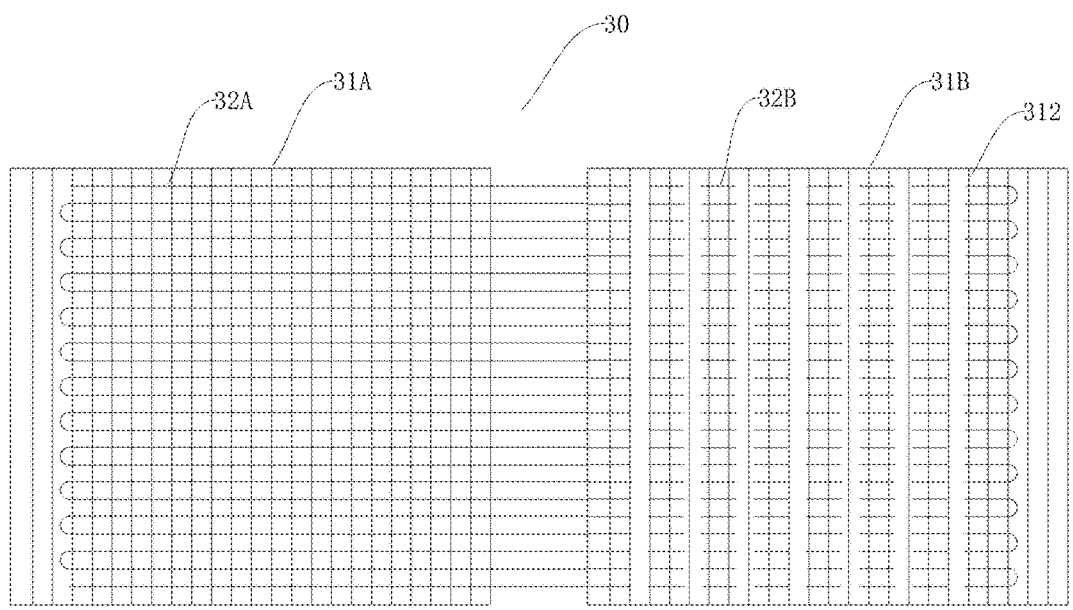
FIG. 1 is a plan view of a solar cell array according to an embodiment of the present disclosure.

100 cell module
10 upper cover plate
20 front adhesive layer
30 cell array
31 cell
31A first cell
31B second cell
311 cell substrate
312 secondary grid line
312A front secondary grid line
312B back secondary grid line
3123 welding portion
313 back electric field
314 back electrode
32 conductive wire
32A front conductive wire
32B back conductive wire
321 metal wire body
322 welding layer
33 short grid line
40 back adhesive layer
50 lower cover plate

DETAILED DESCRIPTION

Embodiments of the present disclosure will be described in detail and examples of the embodiments will be illustrated in the drawings, where same or similar reference numerals are used to indicate same or similar members or members with same or similar functions. The embodiments described herein with reference to the drawings are explanatory, which are used to illustrate the present disclosure, but shall not be construed to limit the present disclosure.

In prior art, the front surface of the solar cell is usually provided with the primary grid lines and the secondary grid lines to output the current generated by the photoelectric effect or chemistry effect. In order to improve the efficiency of the solar cells, solar cell manufacturers conducted extensive researches on how to increase the number of the primary grid lines. In prior art, the number of primary grid lines has been successfully increased from two to three, or even five.

However, in prior art, the primary grid lines are formed by printing the paste containing expensive silver, so the manufacturing cost is very high, and the increase of the silver primary grid lines absolutely causes an increase in cost. Moreover, the current silver primary grid line has a great width (for example, up to over 2 mm), such that the increase of the silver primary grid lines will enlarge the shaded area, and make the photoelectric conversion efficiency low.

Consequently, in order to lower the cost and reduce the shaded area, in prior art, the silver primary grid lines printed on the cells are replaced with metal wires, such as copper wires, which serve as the primary grid lines to output the current. Since the silver primary grid lines are no longer used, the cost can be reduced considerably; the diameter of the copper wire is relatively small, so the shaded area can be decreased. Thus, the number of the primary grid lines can be further increased up to 10. This kind of cell may be called a cell with multiple primary grid lines, in which the metal wire replaces the silver primary grid lines and welding strips in the traditional solar cell.

After extensive research, the inventors of the present disclosure finds if a cell is manufacture in a way that multiple parallel metal wires are drawn simultaneously, cut off, and then welded to the cell simultaneously, due to limitations of sophistication of equipment and process, for example, the influence of stress, the solar cell is bent to some extent when disposed at a free state, so the metal wire needs to remain strained to flatten the cell (a test proves that the minimum strain is at least 2 N for a copper wire with a diameter of 0.2 mm). In order to keep the strain, each metal wire needs to be provided with clips or similar equipment at the two ends thereof, and the equipment occupies certain space, but the space in the cell is limited. Thus, in prior art, at most ten metal wires can be drawn, fixed and welded to a single cell, and it will be difficult to increase the number of the metal wires. The larger the number of the metal wires is, the more free ends there are, such that the equipment needs to control more metal wires at the same time, which is demanding as for the wiredrawing equipment. Moreover, the space of the solar cells is limited. For example, the dimension of a single cell is 156 mm×156 mm. In such limited space, the multiple metal wires need to be controlled accurately at the same time, which is demanding as for the equipment, especially as for the accuracy. Currently, it is still difficult to control and weld multiple metal wires simultaneously in actual production, so the number of the conductive wires is limited, usually at most about ten, which is difficult to realize.

In order to solve the above problem, relevant patents (US20100275976 and US20100043863) provide a technical solution that multiple metal wires are fixed on a transparent film. That's to say, multiple parallel metal wires are fixed on the transparent film by adhesion; then, the transparent film bound with the multiple parallel metal wires is attached to the cell; finally the metal wires contact with the secondary grid lines on the cell by lamination. By this method, the multiple metal wires are fixed via the transparent film, which solves the problem of controlling the multiple metal wires simultaneously, and further increases the number of the metal wires. However, the technical solution almost abandons the welding process. That's to say, the metal wires are not connected with the secondary grid lines by the welding process; instead, the metal wires contact with the secondary grid lines by the laminating process, so as to output the current.

The above technical solution can further increase the number of the metal wires, but the transparent film may affect the light absorption, which causes certain degree of shading, and thus lowers the photoelectric conversion efficiency.

Furthermore, the above technical solution cannot connect the metal wires with the secondary grid lines by the welding process, because the melting temperature of the transparent film must be higher than the welding temperature (usually around 140° C.). Otherwise the transparent film will melt in the process of welding, which may lose the function of fixing the metal wires, and then the metal wires drift, resulting in poor welding effects.

Moreover, it is known to those skilled in the art that the solar cells in use are sealed to prevent moisture and air from penetrating the cells, which may cause corrosion and short circuits. The encapsulating material at present is EVA whose melting point is 70° C. to 80° C., much lower than the welding temperature. If the welding process is employed, as said above, the melting temperature of the transparent film must be higher than the welding temperature, which is higher than the melting point of the encapsulating material. Thus, in the encapsulating process, the encapsulating material (EVA) will melt at the encapsulating temperature, but the transparent film will not, such that the melting encapsulating material cannot penetrate the solid transparent film to completely seal the cells. Hence, the sealing effect is poor, and the actual product tends to fail. In terms of encapsulating, the melting temperature of the transparent film needs to be lower than the welding temperature, which is an evident paradox.

Therefore, the technical solution of fixing the metal wires via the transparent film cannot adopt the welding process to weld the metal wires with the secondary grid lines. The metal wires are merely in contact with the secondary grid lines on the cells, i.e. the metal wires are only placed on the secondary grid lines. Thus, the connection strength of the metal wires and the secondary grid lines is so low that the metal wires tend to separate from the secondary grid lines in the laminating process or in use, which causes bad contact, low efficiency of the cells, or even failure thereof. Consequently, the product in this technical solution is not promoted and commercialized. There is no relatively mature solar cell without primary grid lines.

Moreover, in solar cells without primary grid lines, since the conductive wires are metal wires of very small diameter, the welding of the conductive wires and the secondary grid lines is relatively difficult, which may cause insufficient welding and bad contact. In the process of welding, the metal wire needs to be strained to some extent, i.e. being in a straight state, so there must be stress in the metal wire. After welding, the metal wire tends to fall off, thereby lowering the efficiency of the cells considerably and even resulting in failure thereof.

The present disclosure seeks to solve at least one of the problems existing in the related art to at least some extent.

The solar cell with multiple primary grid lines provided in the present disclosure can be commercialized for mass production, and easy to manufacture with simple equipment, especially in low cost.

Thus, the present disclosure provides a solar cell unit that is easy to manufacture in low cost, and improves the photoelectric conversion efficiency.

Thus, the present disclosure provides a solar cell array that is easy to manufacture in low cost, and improves the photoelectric conversion efficiency.

Thus, the present disclosure provides a solar cell module with the above solar cell array, and the solar cell module is easy to manufacture in low cost, and improves the photoelectric conversion efficiency.

The present disclosure further provides a method for manufacturing the solar cell module.

Through extensive research, the inventors of the present disclosure finds that when the metal wire is welded with the secondary grid lines on the cell substrate, there is great stress because the metal wire is too thin, such that the welding between the metal wire and the secondary grid lines is not solid. The metal wire may crack and fall in less than one month, and hence the cell can no longer be used. Moreover, the secondary grid lines involve the issue of shaded surface, which may affect the light absorption rate. Therefore, the development of the technology is hindered.

According to a first aspect of embodiments of the present disclosure, a solar cell unit includes a cell which comprises a cell substrate and a secondary grid line disposed on a front surface of the cell substrate; a conductive wire intersected and welded with the secondary grid line, and the secondary grid line having a width in a welding position with the conductive wire greater than a width thereof in a non-welding position.

As for the solar cell unit according to embodiments of the present disclosure, the portion where the secondary grid lines are welded with the conductive wires is widen, while other portions are relatively narrow, which makes it easier to weld the conductive wires with the secondary grid lines more reliably, and to manufacture the welding portion, thereby reducing the cost. In addition, the connection strength of the conductive wires and the secondary grid lines is enhanced, and only the portion of the secondary grid line welded with the conductive wires needs to be broadened. In such a case, other portions of the secondary grid lines can be further narrowed, such that the shaded area is decreased, which improves the photoelectric conversion efficiency of the solar cell.

According to a second aspect of embodiments of the present disclosure, a solar cell array includes a plurality of solar cell units which are the solar cell units according to the above embodiments, and cells of the adjacent cell units are connected by the conductive wires.

According to a third aspect of embodiments of the present disclosure, a solar cell module includes an upper cover plate, a front adhesive layer, a cell array, a back adhesive layer and a back plate superposed in sequence, the cell array being a solar cell array according to the above embodiments.

According to a fourth aspect of embodiments of the present disclosure, a method for manufacturing a solar cell module includes: providing a cell which includes a cell substrate and a secondary grid line disposed on a front surface of the cell substrate; welding a conductive wire constituted by a metal wire with the secondary grid line to obtain a solar cell unit, in which the secondary grid line has a width in a welding position with the conductive wire greater than a width thereof in a non-welding position; superposing an upper cover plate, a front adhesive layer, the solar cell unit, a back adhesive layer and a back plate in sequence, in which a front surface of the solar cell faces the front adhesive layer, a back surface thereof facing the back adhesive layer, and laminating them to obtain the solar cell module.

Part of technical terms in the present disclosure will be elaborated herein for clarity and convenience of description.

According to one embodiment of the present disclosure, referring to FIGS. 1-12, a cell unit includes a cell 31 and conductive wires 32, so the conductive wires 32 can be called the conductive wires 32 of the cell unit.

Cell 31 includes a cell substrate 311, secondary grid lines 312 disposed on a front surface (the surface on which light is incident) of the cell substrate 311, a back electric field 313 disposed on a back surface of the cell substrate 311, and back electrodes 314 disposed on the back electric field 313. Thus, the secondary grid lines 312 can be called the secondary grid lines 312 of the cell 31, the back electric field 313 called the back electric field 313 of the cell 31, and the back electrodes 314 called the back electrodes 314 of the cell 31.

The cell substrate 311 can be an intermediate product obtained by subjecting, for example, a silicon chip to processes of felting, diffusing, edge etching and silicon nitride layer depositing. However, it shall be understood that the cell substrate 311 in the present disclosure is not limited to be formed by the silicon chip.

In other words, the cell 31 comprises a silicon chip, some processing layers on a surface of the silicon chip, secondary grid lines on a front surface, and a back electric field 313 and back electrodes 314 on a back surface, or includes other equivalent solar cells of other types without any front electrode.

The cell unit, the cell 31 and the cell substrate 311 are used to illustrate the present disclosure, but shall not be construed to limit the present disclosure.

A solar cell array 30 is arranged by a plurality of cells, i.e. by a plurality of cells 31 connected by conductive wires 32.

In the solar cell array 30, a metal wire body 321 constitutes the conductive wire 32 of the cell unit, and extends between surfaces of the adjacent cells 31, which shall be understood in a broad sense that the metal wire body 321 may extend between surfaces of the adjacent cells 31, or may be connected with a secondary grid line 312 of the cell 31, or may be connected with a secondary grid line 312 of a first cell 31 and a back electrode 314 of a second cell 31 adjacent to the first cell 31, or a part of the metal wire body 321 is connected with the secondary grid line 312 and the other part of the metal wire body 321 is connected with a back electrode 314 of the cell 31.

That's to say, the metal wire body 321 can extend between front surfaces of adjacent cells 31, or extend between a front surface of a first cell 31 and a back surface of a second cell 31 adjacent to the first cell 31. When the metal wire body 321 extends between the front surface of the first cell 31 and the back surface of the second cell 31 adjacent to the first cell 31, the conductive wire 32 may include a front conductive wire 32A extending on the front surface of the cell 31 and electrically connected with the secondary grid lien 312 of the cell 31, and a back conductive wire 32B extending on the back surface of the cell 31 and electrically connected with the back electrode 314 of the cell 31. Part of the metal wire body 321 between the adjacent cells 31 can be called a connection conductive wire.

All the ranges disclosed in the present disclosure include endpoints, and can be individual or combined. It shall be understood that the terminals and any value of the ranges are not limited to an accurate range or value, but also include values proximate the ranges or values.

In the present disclosure, orientation terms such as "upper" and "lower" usually refer to the orientation "upper" or "lower" as shown in the drawings under discussion, unless specified otherwise; "front surface" refers to a surface of the solar cell module facing the light when the module is in operation, i.e. a surface on which light is incident, while "back surface" refers to a surface of the solar cell module back to the light when the module is in operation.

In the following, the solar cell will be described according to the embodiments of the present disclosure.

As shown in FIG. 1 to FIG. 13, the solar cell unit according to the embodiments of the present disclosure includes a cell 31 and conductive wires 32. The cell 31 comprises a cell substrate 311 and secondary grid lines 312 disposed on a front surface of the cell substrate 311; the conductive wires 32 are intersected and welded with the secondary grid lines 312, and the secondary grid lines have a width in a welding position with the conductive wire 32 greater than a width thereof in a non-welding position.

In other words, the solar cell unit according to the present disclosure is mainly formed with the cell 31 and conductive wires 32; the cell 31 is mainly constituted by the cell substrate 311 and secondary grid lines 312. In the present disclosure, the secondary grid lines 312 disposed on the front surface of the cell substrate 311 will be described in detail.

Particularly, as shown in FIG. 1, the secondary grid lines 312 are disposed on the front surface of the cell substrate 311 and extend in one direction. The conductive wires 32 are disposed on the secondary grid lines 312 and extend in another direction. The conductive wires 32 and the secondary grid lines 312 are welded at a portion where they are intersected. Usually, the conductive wires 32 are broader than the secondary grid lines 312, and the secondary grid lines 312 have a width in the welding portion with the conductive wire 32 greater than a width thereof in a non-welding portion.

Figure 13:
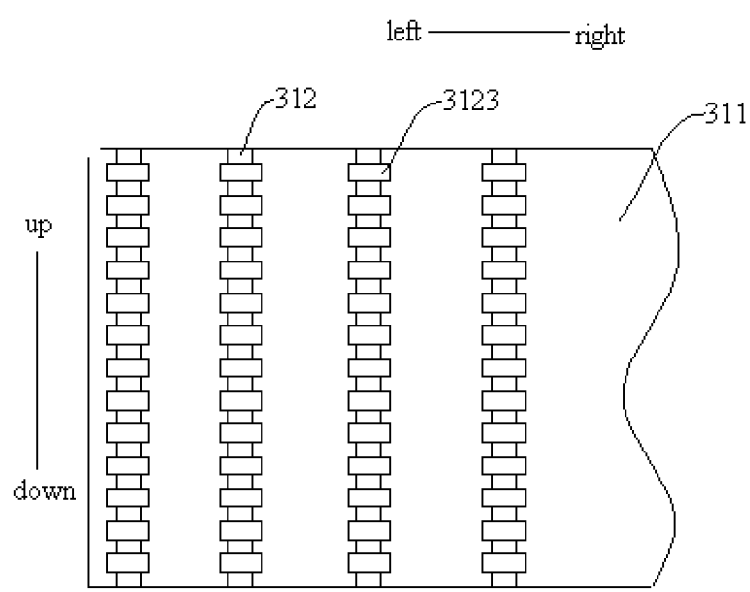
FIG. 13 is a schematic diagram of a secondary grid line of a solar cell according to an embodiment of the present disclosure.

That's to say, as shown in FIG. 13, the secondary grid lines 312 are broadened in a position where the secondary grid lines 312 are intersected with the conductive wires 32, and the broadened part of the secondary grid lines 312 is taken as a welding portion 3123 to be welded with the conductive wires 32. The welding portion 3123 of the secondary grid lines 312 is broaden to facilitate welding the secondary grid lines 312 with the conductive wires 32. Meanwhile, other parts of the secondary grid lines 312 remain the original width, or even reduced width, which not only can guarantee the welding effect of the secondary grid lines 312 and the conductive wires 32, but also can reduce the shaded area.

Consequently, as for the solar cell according to the embodiments of the present disclosure, the portion where the secondary grid lines 312 are welded with the conductive wires 32 is widen, while other portions are relatively narrow, which makes it easier to weld the conductive wires 32 with the secondary grid lines 312, and to manufacture the welding portion, thereby reducing the cost. In such a case, the connection strength of the conductive wires 32 and the secondary grid lines 312 is enhanced, and the shaded area is decreased, which improves the photoelectric conversion efficiency of the solar cell.

According to an embodiment of the present disclosure, the secondary grid lines 312 have a width in the welding position greater than or equal to a diameter or width of the conductive wires 32.

In other words, the welding portion 3123 of the secondary grid lines 312 has a line width larger than or equal to that of the conductive wires 32. Thus, the portion where the secondary grid lines 312 are welded with the conductive wires 32 is configured to have a line width larger than or equal to that of the conductive wires 32, so as to further enhance the connection strength of the conductive wires 32 and the secondary grid lines 312, and to facilitate welding to reduce the cost.

In some embodiments of the present disclosure, the conductive wires 32 are constituted by the metal wire body 321. In some embodiments, preferably, the metal wire body 321 is a copper wire, but the present disclosure is not limited thereto. For example, the metal wire body 321 can be an aluminum wire. Preferably, the metal wire body 321 has a circular cross section, such that more sunlight can irradiate the cell substrate to further improve the photoelectric conversion efficiency.

Further, the metal wire body 321 is coated with a welding layer 322 at least at a part welded with the secondary grid lines 312, and the conductive wires 32 are welded with the secondary grid lines 312 via the welding layer 322.

Figure 4:
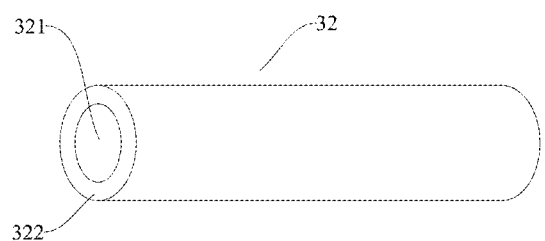
FIG. 4 is a schematic diagram of a metal wire for forming a conductive wire according to embodiments of the present disclosure.

More preferably, as shown in FIG. 4, the metal wire body 321 is coated with a welding layer 322, such as a conductive adhesive layer or a welding layer. The metal wire is welded with the secondary grid line and/or the back electrode by the welding layer, such that it is convenient to electrically connect the metal wire body 321 with the secondary grid lines 312, and to avoid drifting of the metal wire in the connection process so as to guarantee the photoelectric conversion efficiency. Of course, the electrical connection of the metal wire body 321 with the cell 31 can be conducted when or before the solar cell module is laminated, and preference is given to the latter.

In some other embodiments of the present disclosure, the secondary grid lines 312 are coated with a welding layer by which the conductive wires 32 are welded with the secondary grid lines 312.

That's to say, the conductive wires 32 and the secondary grid lines 312 can be welded by arranging the welding layer on the conductive wires 32 or on the secondary grid lines 312. When the welding layer is disposed on the secondary grid lines 312, only the welding point on the secondary grid lines 312 is usually provided with the welding layer, so as to guarantee the effect of welding the conductive wires 32 with the secondary grid lines 312, and to avoid the influence on the shaded area to guarantee the photoelectric conversion efficiency.

According to an embodiment of the present disclosure, the secondary grid line 312 has a width of 0.08-0.24 mm in the welding position, and a width of 0.015-0.03 mm in the non-welding position; the width of the secondary grid line 312 is a maximum size in a direction orthogonal to a longitudinal direction of the secondary grid line 312.

Specifically, the secondary grid lines 312 extend in an up-to-down direction (as shown in FIG. 13), while the conductive wires 32 extend in a right-to-left direction (not shown in FIG. 13 which mainly describes the secondary grid lines, no need for conductive wires), and the conductive wires 32 and the secondary grid lines 312 are vertically intersected. The width of the secondary grid line 312 refers to its size in the right-to-left direction; the width of the welding portion 3123 of the secondary grid line 312 also refers to its width in the right-to-left direction.

In the embodiment, the welding portion 3123 of the secondary grid line 312 has a width of 0.08-0.24 mm, and other parts of the secondary grid line 312 have a width of 0.015-0.03 mm. For the secondary grid line 312 of this structure, the area of a single welding portion 3123 can be increased, so as to improve peel strength and reduce the shaded area of the secondary grid lines 312. Moreover, the amount of silver is decreased, which not only improves the photoelectric conversion efficiency, but also lowers the cost.

Alternatively, in some other specific embodiments of the present disclosure, the secondary grid line 312 has a height of 0.01-0.03 mm in the welding position, and a height of 0.005-0.01 mm in the non-welding position.

In other words, the secondary grid line 312 increases both width and thickness at the welding portion 3123. Hence, the secondary grid line 312 of this structure can further the stability of connection with the conductive wire 32, so as to enhance the peel strength of the conductive wire 32.

In the following, the solar cell array 30 will be described according to the embodiments of the present disclosure.

According to the embodiments of the present disclosure, the solar cell array 30 includes a plurality of solar cell units which are the solar cell units according to the above embodiment, cells 31 of adjacent cell units being connected by the conductive wires 32.

Since the solar cell unit according to the above embodiment of the present disclosure has the above technical effect, the solar cell array 30 according to the embodiment of the present disclosure has the corresponding technical effect, i.e. making it easier to weld the conductive wires 32 with the secondary grid lines 312 of the cell 31 of the adjacent solar cell, and to manufacture the welding portion, thereby reducing the cost. In such a case, the connection strength of the conductive wires 32 and the secondary grid lines 312 is enhanced, and the shaded area is decreased, which improves the photoelectric conversion efficiency of the solar cell.

Particularly, in some embodiments of the present disclosure, the conductive wires are constituted by the metal wire body 321 which extends reciprocally between a surface of a first cell 31 and a surface of a second cell 31 adjacent to the first cell 31.

The cell unit is formed by the cell 31 and the conductive wires 32 constituted by the metal wire S which extends on the surface of the cell 31. In other words, the solar cell array 30 according to the embodiments of the present disclosure is formed with a plurality of cell units; the conductive wires 32 of the plurality of cells are formed by the metal wire body 321 which extends reciprocally between the surfaces of the cells 31.

It shall be understood that the term "extending reciprocally" in this disclosure can be called "winding" which means that the metal wire S extends between the surfaces of the cells 31. For example, referring to FIG. 1, in some circumstances, the metal wire extends between the surfaces of the cells 31 in the same plane, such as either between the front surfaces or between the bottom surfaces of the cells, to form a serpentine pattern. In some other circumstances, the metal wire S extends between the surfaces of the cells 31 in multiple planes, such as between both the front surface of a cell and the bottom surface of an adjacent cell, to form a serpentine pattern. In yet other circumstances, the metal wire S extends between the surfaces of the cells 31 both in the same plane and in multiple planes, such as sometimes between either the front surfaces or the bottom surfaces of some adjacent cells, and at other times between both the front surface of a certain cell and the bottom surface of an adjacent cell, to form a serpentine pattern. The plurality of conductive wires equals two or more passes of the serpentine shaped pattern. Preferably, two or more passes of the serpentine shaped pattern on the same plane are substantially parallel to each other. More preferably, all the passes of the serpentine shaped pattern on the same plane are substantially parallel to each other.

In the present disclosure, it shall be understood in a broad sense that "the metal wire body 321 extends reciprocally between surfaces of the cells 31." For example, the metal wire body 321 may extend reciprocally between a front surface of a first cell 31 and a back surface of a second cell 31 adjacent to the first cell 31; the metal wire body 321 may extend from a surface of the first cell 31 through surfaces of a predetermined number of middle cells 31 to a surface of the last cell 31, and then extends back from the surface of the last cell 31 through the surfaces of a predetermined number of middle cells 31 to the surface of the first cell 31, extending reciprocally like this.

In addition, when the cells 31 are connected in parallel by the metal wire body 321, the metal wire body 321 can extend on front surfaces of two cells, such that the metal wire body 321 constitutes front conductive wires 32A of the two cells connected in parallel. Alternatively, a first metal wire body 321 extends reciprocally between the front surfaces of the cells, and a second metal wire body 321 extends reciprocally between the back surfaces of the cells, such that the first metal wire body 321 constitutes front conductive wires 32A, and the second metal wire body 321 constitutes back conductive wires 32B.

When the cells 31 are connected in series by the metal wire body 321, the metal wire body 321 can extend reciprocally between a front surface of a first cell 31 and a back surface of a second cell 31 adjacent to the first cell 31, such that part of the metal wire body 321 which extends on the front surface of the first cell 31 constitutes front conductive wires 32A, and part thereof which extends on the back surface of the second cell 31 constitutes back conductive wires 32B. In the present disclosure, unless specified otherwise, the conductive wires 32 can be understood as the front conductive wires 32A, the back conductive wires 32B, or the combination thereof.

The term "extending reciprocally" can be understood as that the metal wire body 321 extends reciprocally once to form two conductive wires 32 which form a U-shape or V-shape structure by the metal wire body 321 extending reciprocally, yet the present disclosure is not limited to the above.

In the solar cell array 30 according to the embodiments of the present disclosure, a plurality of conductive wires 32 of the cell units are constituted by the metal wire body 321 which extends reciprocally; and the adjacent cells 31 are connected by the conductive wires 32. Hence, the conductive wires 32 of the cell units in the present disclosure are used to output the current, and are not necessarily printed by expensive silver paste, and can be manufactured in a simple manner without using a solder strip to connect the cells. It is easy and convenient to connect the metal wire body 321 with the secondary grid line and the back electrode, so that the cost of the cells is reduced considerably.

Moreover, since the conductive wires 32 are constituted by the metal wire body 321 which extends reciprocally, the width of the conductive wires 32 (i.e. the width of projection of the metal wire on the cell) is much smaller than that of the current primary grid lines printed by silver paste, thereby decreasing the shaded area. Further, the number of the conductive wires 32 can be adjusted easily, and thus the resistance of the conductive wires 32 is reduced, compared with the conductive wires made of the silver paste, and the efficiency of photoelectric conversion is improved. Since the metal wire body 321 extends reciprocally to form the conductive wires, when the cell array 30 is used to manufacture the solar cell module 100, the metal wire body 321 is easier to control accurately and will not tend to shift, i.e. the metal wire is not easy to "drift", which will not affect but further improve the photoelectric conversion efficiency.

Therefore, the solar cell array 30 according to the embodiments of the present disclosure has low cost and high photoelectric conversion efficiency.

In the following, the solar cell array 30 according to specific embodiments of the present disclosure will be described with reference to the drawings.

The solar cell array 30 according to a specific embodiment of the present disclosure is illustrated with reference to FIG. 1 to FIG. 3.

Figure 2:
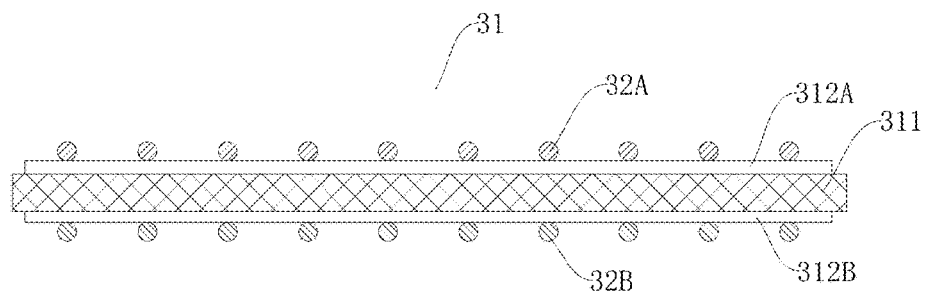
FIG. 2 is a longitudinal sectional view of a solar cell array according to an embodiment of the present disclosure.
Figure 3:
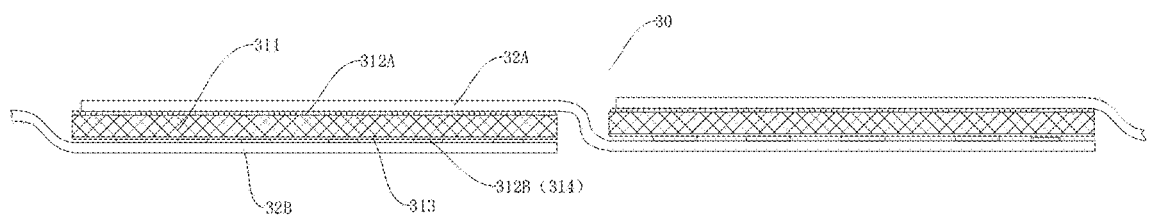
FIG. 3 is a transverse sectional view of a solar cell array according to embodiments of the present disclosure.

In the embodiment shown in FIG. 1 to FIG. 3, two cell units in the solar cell array 30 are shown. In other words, it shows two cells bodies 31 connected with each other via the conductive wire 32 constituted by the metal wire body 321.

It can be understood that the cell 31 comprises a cell substrate 311, a secondary grid line 312 (a front secondary grid line 312A) disposed on a front surface of the cell substrate 311, a back electric field 313 disposed on a back surface of the cell substrate 311, and a back electrode 314 disposed on the back electric field 313. In the present disclosure, it can be understood that the back electrode 314 may be a back electrode of a traditional cell, for example, printed by the silver paste, or may be a back secondary grid line 312B similar to the secondary grid line on the front surface of the cell substrate, or may be multiple discrete welding portions, unless specified otherwise. The secondary grid line refers to the secondary grid line 312 on the front surface of the cell substrate 311, unless specified otherwise.

Particularly, in an embodiment of the present disclosure, the metal wire body 321 extends reciprocally between a front surface of a first cell 31 and a back surface of a second cell 31.

As shown in FIG. 1 to FIG. 3, the solar cell array in the embodiment includes two cells 31A, 31B (called a first cell 31A and a second cell 31B respectively for convenience of description). The metal wire body 321 extends reciprocally between the front surface of the first cell 31A (a front surface, i.e. an upper surface in FIG. 2) and the back surface of the second cell 31B, such that the metal wire body 321 constitutes a front conductive wire of the first cell 31A and a back conductive wire of the second cell 31B. The metal wire body 321 is electrically connected with the secondary grid line of the first cell 31A (for example, being welded or bounded by a conductive adhesive), and electrically connected with the back electrode of the second cell 31B.

In an embodiment of the present disclosure, back electrodes 314 are disposed on the back surface of the cell substrate 311, and the metal wire body 321 is welded with the back electrodes 314.

That's to say, in the embodiment, front secondary grid lines 312A are disposed on the front surface of the cell substrate 311, and back electrodes 314 are disposed on the back surface thereof. When the conductive wires 32 are located on the front surface of the cell substrate 311, the conductive wires 32 are welded with the front secondary grid lines 312A; when the conductive wires 32 are located on the back surface of the cell substrate 311, the conductive wires 32 are welded with the back electrodes 314 on the back surface of the cell substrate 311.

In some embodiments, there is a metal wire body 321. The metal wire body 321 extends reciprocally between the first cell 31A and the second cell 31B for 10 to 60 times. Preferably, as shown in FIG. 1, the metal wire extends reciprocally for 12 times to form 24 conductive wires, and there is only one metal wire. In other words, a single metal wire extends reciprocally for 12 times to form 24 conductive wires, and the distance of the adjacent conductive wires can range from 2.5 mm to 15 mm. In this embodiment, the number of the conductive wires is increased, compared with the traditional cell, such that the distance between the secondary grid line and the conductive wire which the current runs through is decreased, so as to reduce the resistance and improve the photoelectric conversion efficiency. In the embodiment shown in FIG. 1, the adjacent conductive wires form a U-shape structure, for convenience of winding the metal wire. Alternatively, the present disclosure is not limited to the above. For example, the adjacent conductive wires may form a V-shape structure.

In some embodiments, preferably, the metal wire is a copper wire, yet the present disclosure is not limited thereto. For example, the metal wire body 321 may be an aluminum wire. Preferably, the metal wire body 321 has a circular cross section, such that more sunlight can reach the cell substrate to further improve the photoelectric conversion efficiency.

More preferably, as shown in FIG. 4, the metal wire body 321 is coated with a welding layer 322. The metal wire is welded with the secondary grid line and/or the back electrode by the welding layer, such that it is convenient to electrically connect the metal wire with the secondary grid line and/or the back electrode, and to avoid drifting of the metal wire in the connection process so as to guarantee the photoelectric conversion efficiency. Of course, the electrical connection of the metal wire with the cell can be conducted when or before the solar cell module is laminated, and preference is given to the latter.

In some embodiments, preferably, before the metal wire contact the cell, the metal wire extends under a strain, i.e. straightening the metal wire. After the metal wire is connected with the secondary grid line and the back electrode of the cell, the strain of the metal wire can be released, so as to further avoid the drifting of the conductive wire when the solar cell module is manufacture, and to guarantee the photoelectric conversion efficiency.

Figure 5:
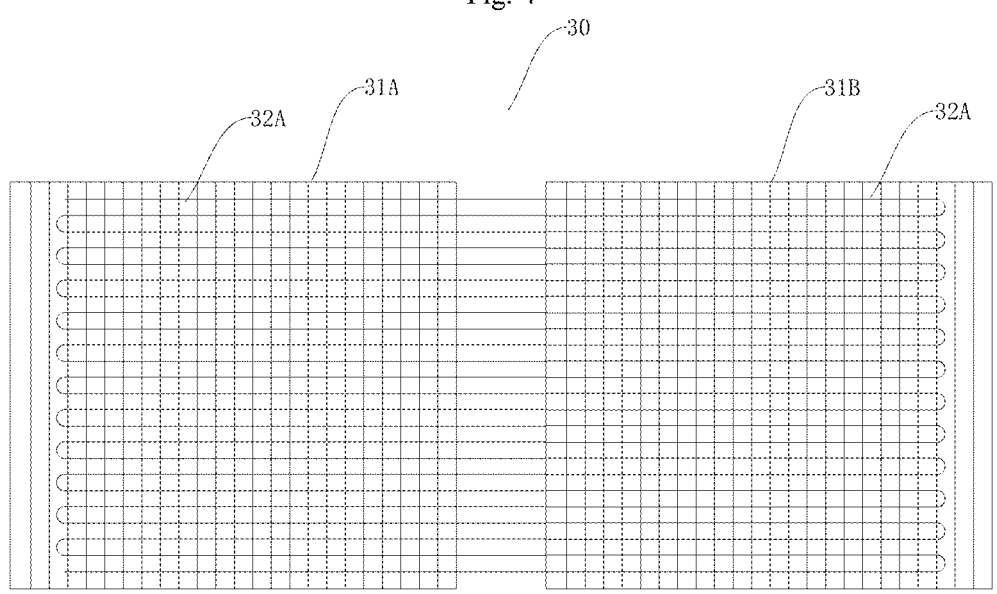
FIG. 5 is a plan view of a solar cell array according to another embodiment of the present disclosure.

FIG. 5 is a schematic diagram of a solar cell array according to another embodiment of the present disclosure. As shown in FIG. 5, the metal wire extends reciprocally between the front surface of the first cell 31A and the front surface of the second cell 31B, such that the metal wire constitutes front conductive wires at the front surfaces of the first cell 31A and the second cell 31B. In such a way, the first cell 31A and the second cell are connected in parallel. Of course, it can be understood that preferably the back electrode of the first cell 31A and the back electrode of the second cell 31B can be connected via a back conductive wire constituted by another metal wire which extends reciprocally. Alternatively, the back electrode of the first cell 31A and the back electrode of the second cell 31B can be connected in a traditional manner.

The solar cell array 30 according to another embodiment of the present disclosure is illustrated with reference to FIG. 6.

The solar cell array 30 according to the embodiment of the present disclosure comprises n×m cells 31. In other words, a plurality of cells 31 are arranged in an n×m matrix form, n representing a column, and m representing a row. More specifically, in the embodiment, 36 cells 31 are arranges into six columns and six rows, i.e. n=m=6. It can be understood that the present disclosure is not limited thereto. For example, the column number and the row number can be different. For convenience of description, in FIG. 6, in a direction from left to right, the cells 31 in one row are called a first cell 31, a second cell 31, a third cell 31, a fourth cell 31, a fifth cell 31, and a sixth cell 31 sequentially; in a direction from up to down, the columns of the cells 31 are called a first column of cells 31, a second column of cells 31, a third column of cells 31, a fourth column of cells 31, a fifth column of cells 31, and a sixth column of cells 31 sequentially.

In a row of the cells, the metal wire extends reciprocally between a surface of a first cell 31 and a surface of a second cell 31 adjacent to the first cell 31; in two adjacent rows of cells 31, the metal wire extends reciprocally between a surface of a cell 31 in a $a^{th}$ row and a surface of a cell in a $(a+1)^{th}$ row, and $m-1 \geq a \geq 1$.

Figure 6:
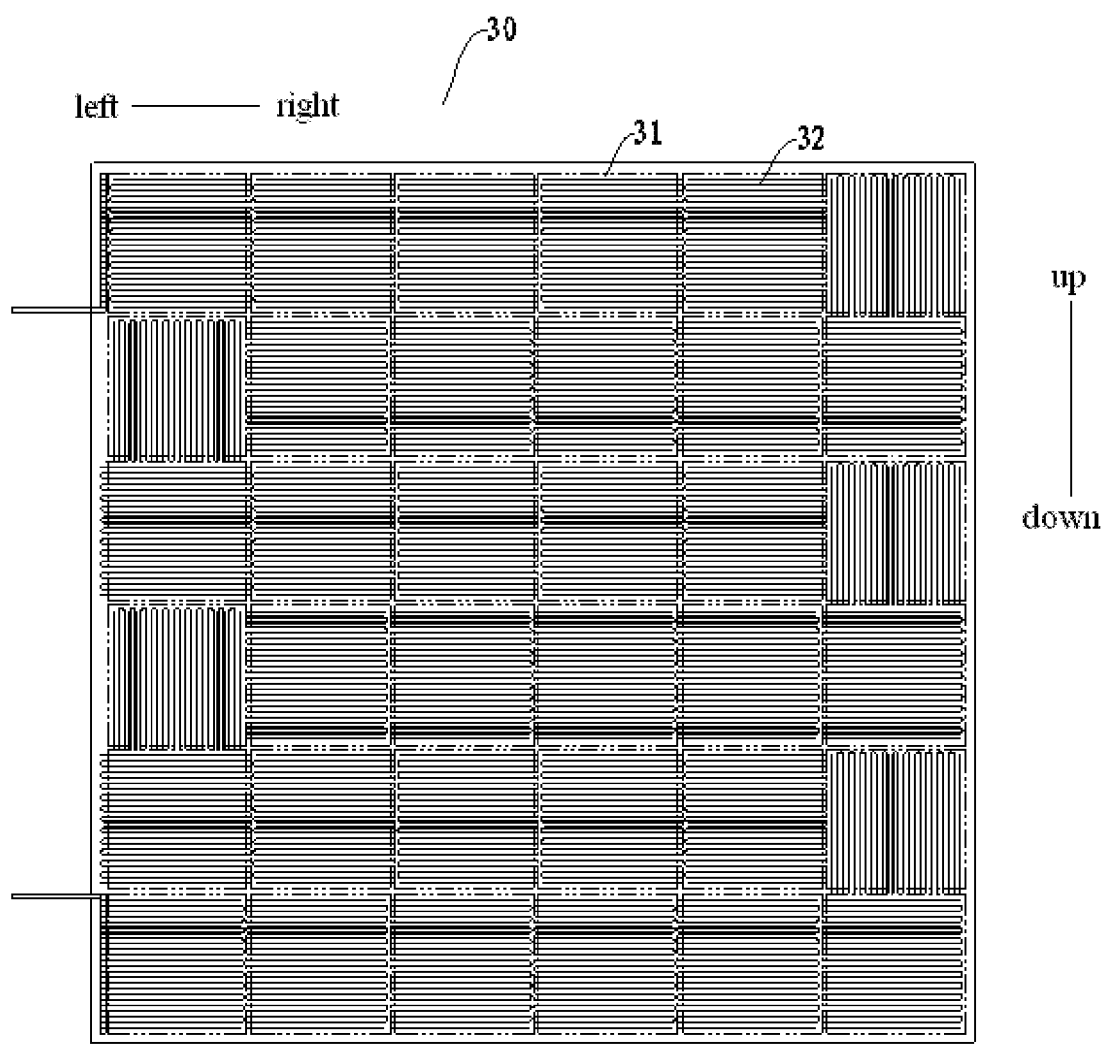
FIG. 6 is a plan view of a solar cell array according to another embodiment of the present disclosure.

As shown in FIG. 6, in a specific example, in a row of the cells 31, the metal wire extends reciprocally between a front surface of a first cell 31 and a back surface of a second cell 31 adjacent to the first cell 31, so as to connect the cells in one row in series. In two adjacent rows of cells 31, the metal wire extends reciprocally between a front surface of a cell 31 at an end of the $a^{th}$ row and a back surface of a cell 31 at an end of the $(a+1)^{th}$ row, to connect the two adjacent rows of cells 31 in series.

More preferably, in the two adjacent rows of cells 31, the metal wire extends reciprocally between the surface of the cell 31 at an end of the $a^{th}$ row and the surface of the cell 31 at an end of the $(a+1)^{th}$ row, the end of the $a^{th}$ row and the end of the $(a+1)^{th}$ row located at the same side of the matrix form, as shown in FIG. 6, located at the right side thereof.

More specifically, in the embodiment as shown in FIG. 6, in the first row, a first metal wire extends reciprocally between a front surface of a first cell 31 and a back surface of the second cell 31; a second metal wire extends reciprocally between a front surface of the second cell 31 and a back surface of a third cell 31; a third metal wire extends reciprocally between a front surface of the third cell 31 and a back surface of a fourth cell 31; a fourth metal wire extends reciprocally between a front surface of the fourth cell 31 and a back surface of a fifth cell 31; a fifth metal wire extends reciprocally between a front surface of the fifth cell 31 and a back surface of a sixth cell 31. In such a way, the adjacent cells 31 in the first row are connected in series by corresponding metal wires.

A sixth metal wire extends reciprocally between a front surface of the sixth cell 31 in the first row and a back surface of a sixth cell 31 in the second row, such that the first row and the second row are connected in series. A seventh metal wire extends reciprocally between a front surface of the sixth cell 31 in the second row and a back surface of a fifth cell 31 in the second row; a eighth metal wire extends reciprocally between a front surface of the fifth cell 31 in the second row and a back surface of a fourth cell 31 in the second row, until a eleventh metal wire extends reciprocally between a front surface of a second cell 31 in the second row and a back surface of a first cell 31 in the second row, and then a twelfth metal wire extends reciprocally between a front surface of the first cell 31 in the second row and a back surface of a first cell 31 in the third row, such that the second row and the third row are connected in series. Sequentially, the third row and the fourth row are connected in series, the fourth row and the fifth row connected in series, the fifth row and the sixth row connected in series, such that the cell array 30 is manufacture. In this embodiment, a bus bar is disposed at the left side of the first cell 31 in the first row and the left side of the first cell 31 in the sixth row respectively; a first bus bar is connected with a conductive wire extending from the left side of the first cell 31 in the first row, and a second bus bar is connected with a conductive wire extending from the left side of the first cell 31 in the sixth row.

As said above, the cells in the embodiments of the present disclosure are connected in series by the conductive wires—the first row, the second row, the third row, the fourth row, the fifth row and the sixth row are connected in series by the conductive wires. As shown in FIGS. Alternatively, the second and third row, and the fourth and fifth rows can be connected in parallel with a diode respectively to avoid light spot effect. The diode can be connected in a manner commonly known to those skilled in the art, for example, by a bus bar.

However, the present disclosure is not limited to the above. For example, the first and second rows can be connected in series, the third and fourth rows connected in series, the fifth and sixth rows connected in series, and meanwhile the second and third rows are connected in parallel, the fourth and fifth connected in parallel. In such a case, a bus bar can be disposed at the left or right side of corresponding rows respectively.

Alternatively, the cells 31 in the same row can be connected in parallel. For example, a metal wire extends reciprocally from a front surface of a first cell 31 in a first row through the front surfaces of the cells 31 in the second row to the sixth row.

Preferably, there is a metal wire extending reciprocally between adjacent cells 31 in a row; and there is a metal wire extending reciprocally between cells 31 in adjacent rows. Thus, adjacent cells 31 can be connected by a single metal wire that extends reciprocally for several times, which is easier to manufacture in lower cost.

In an embodiment of the present disclosure, the metal wire is coated with a welding layer. The ratio of the thickness of the welding layer and the diameter of the metal wire is (0.02-0.5):1.

That's to say, in the cell array 30, the ratio of the thickness of the welding layer and the diameter of the conductive wire 32 (including the front conductive wire 32A and back conductive wire 32B) is (0.02-0.5):1.

In the present disclosure, the conductive wires 32 (including the front conductive wires 32A and back conductive wires 32B) consist of a metal wire and a welding layer coating the metal wire. The welding layer may coat the metal wire completely or partially. When the welding layer coats the metal wire partially, the alloy layer is, preferably, formed at a position where the welding layer is welded with the secondary grid lines 312 of the cell 31. When the welding layer coats the metal wire completely, the welding layer can coat the periphery of the metal wire in a circular manner. The thickness of the welding layer can fall into a relatively wide range. Preferably, the welding layer has a thickness of 1 to 100 μm, more preferably, 1 to 30 μm.

The alloy with a low melting point for forming the welding layer may be a conventional alloy with a low melting point which can be 100 to 220° C. Preferably, the alloy with the low melting point contains Sn, and at least one of Bi, In, Ag, Sb, Pb and Zn, more preferably, containing Sn, Bi, and at least one of In, Ag, Sb, Pb and Zn.

Specifically, the alloy may be at least one of Sn—Bi alloy, In—Sn alloy, Sn—Pb alloy, Sn—Bi—Pb alloy, Sn—Bi—Ag alloy, In—Sn—Cu alloy, Sn—Bi—Cu alloy and Sn—Bi—Zn alloy. Most preferably, the alloy is Bi—Sn—Pb alloy, for example, containing 40 weight percent of Sn, 55 weight percent of Bi, and 5 weight percent of Pb (i.e. Sn40%-Bi55%-Pb5%). The thickness of the welding layer can be 0.001 to 0.06 mm. The conductive wire 32 may have a cross section of 0.01 to 0.5 $mm^2$. The metal wire can be conventional in the art, for example, a copper wire.

In some specific embodiments of the present disclosure, a binding force between the metal wire and the cells 31 ranges from 0.1 N to 0.8 N. That's to say, the binding force between the conductive wires 32 and the cells 31 ranges from 0.1 N to 0.8 N. Preferably, the binding force between the metal wire and the cells ranges from 0.2 N to 0.6 N, so as to secure the welding between the cells and the metal wire, to avoid sealing-off of the cells in the operation and the transferring process and performance degradation due to poor connection, and to lower the cost.

The solar cell module 100 according to embodiments of the present disclosure is illustrated with reference to FIG. 10 and FIG. 11.

Figure 10:
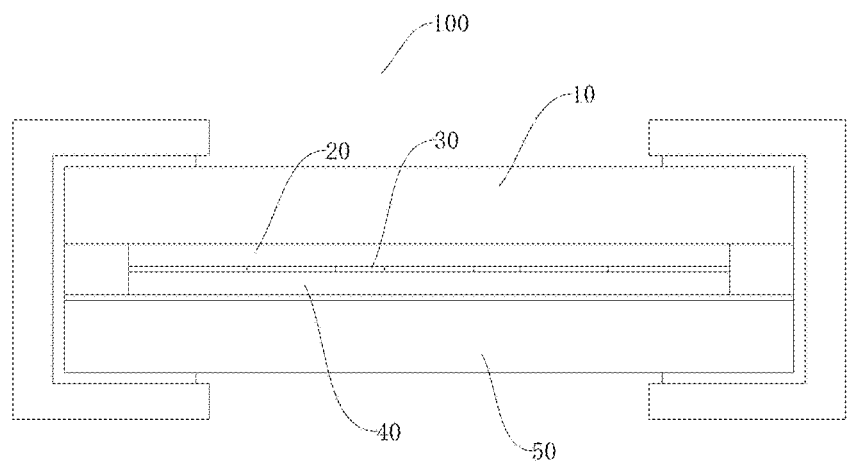
FIG. 10 is a schematic diagram of a solar cell module according to embodiments of the present disclosure.
Figure 11:
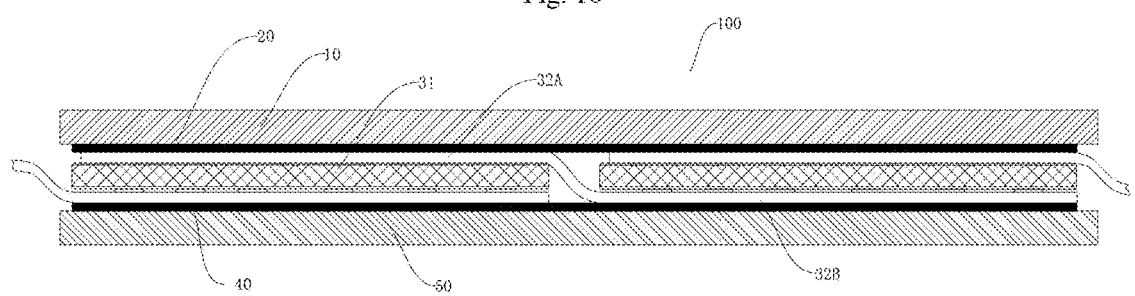
FIG. 11 is a sectional view of part of the solar cell module according to FIG. 10.
Figure 12:
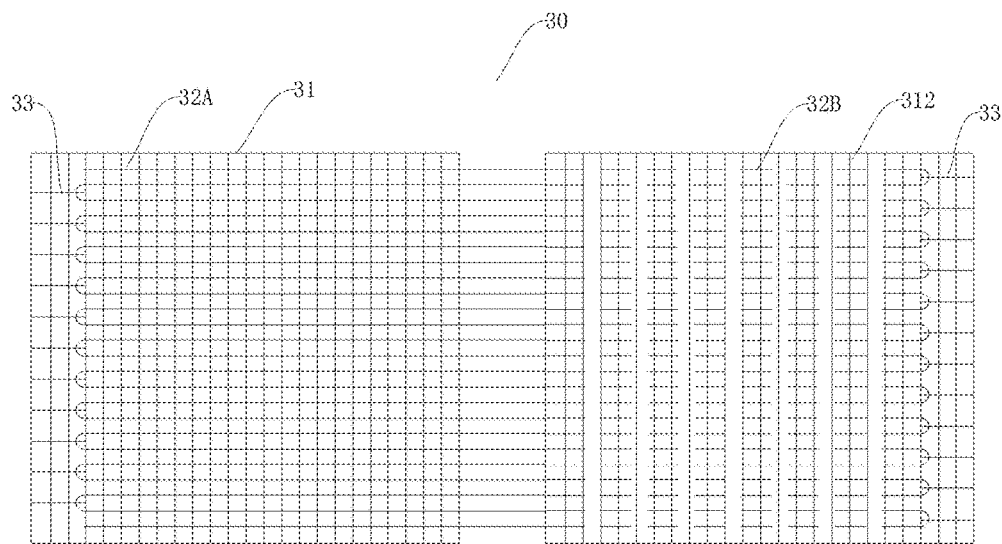
FIG. 12 is a schematic diagram of a solar cell array according to another embodiment of the present disclosure.

As shown in FIG. 10 and FIG. 11, the solar cell module 100 according to embodiments of the present disclosure includes an upper cover plate 10, a front adhesive layer 20, the cell array 30, a back adhesive layer 40 and a back plate 50 superposed sequentially along a direction from up to down.

The front adhesive layer 20 and the back adhesive layer 40 are adhesive layers commonly used in the art. Preferably, the front adhesive layer 20 and the back adhesive layer 40 are polyethylene-octene elastomer (POE) and/or ethylene-vinyl acetate copolymer (EVA). In the present disclosure, polyethylene-octene elastomer (POE) and/or ethylene-vinyl acetate copolymer (EVA) are conventional products in the art, or can be obtained in a method known to those skilled in the art.

In the embodiments of the present disclosure, the upper cover plate 10 and the back plate 50 can be selected and determined by conventional technical means in the art. Preferably, the upper cover plate 10 and the back plate 50 are transparent plates respectively, for example, glass plates.

In the process of manufacturing the solar cell module 100, the conductive wire can be first welded with the secondary grid lines and the back electrode of the cell 31, and then superposed and laminated.

Other components of the solar cell module 100 according to the present disclosure are known in the art, which will be not described in detail herein.

Specifically, the solar module 100 includes an upper cover plate 10, a front adhesive layer 20, the cell array 30, a back adhesive layer 40 and a back plate 50. The cell array 30 includes a plurality of cells 31, and adjacent cells 31 are connected by the plurality of conductive wires 32. The conductive wires 32 are constituted by the metal wire S which extends reciprocally between surfaces of adjacent cells. The conductive wires 32 are welded with the secondary grid lines. The front adhesive layer 20 contacts with the conductive wires 32 directly and fills between the adjacent conductive wires 32.

That's to say, the solar cell module 100 according to the present disclosure includes an upper cover plate 10, a front adhesive layer 20, the cell array 30, a back adhesive layer 40 and a back plate 50 superposed sequentially along a direction from up to down. The cell array 30 includes a plurality of cells 31 and conductive wires 32 for connecting the plurality of cells 31. The conductive wires are constituted by the metal wire S which extends reciprocally between surfaces of two adjacent cells 31.

The conductive wires 32 are electrically connected with the cells 31, in which the front adhesive layer 20 on the cells 31 contacts with the conductive wires 32 directly and fills between the adjacent conductive wires 32, such that the front adhesive layer 20 can fix the conductive wires 32, and separate the conductive wires 32 from air and moisture from the outside world, so as to prevent the conductive wires 32 from oxidation and to guarantee the photoelectric conversion efficiency.

Thus, in the solar cell module 100 according to embodiments of the present disclosure, the conductive wires 32 constituted by the metal wire S which extends reciprocally replace traditional primary grid lines and solder strips, so as to reduce the cost. The metal wire S extends reciprocally to decrease the number of free ends of the metal wire S and to save the space for arranging the metal wire S, i.e. without being limited by the space. The number of the conductive wires 32 constituted by the metal wire which extends reciprocally may be increased considerably, which is easy to manufacture, and thus is suitable for mass production. The front adhesive layer 20 contacts with the conductive wires 32 directly and fills between the adjacent conductive wires 32, which can effectively isolate the conductive wires from air and moisture to prevent the conductive wires 32 from oxidation to guarantee the photoelectric conversion efficiency.

In some specific embodiments of the present disclosure, the metal wire S extends reciprocally between a front surface of a first cell and a back surface of a second cell adjacent to the first cell; the front adhesive layer 20 contacts with the conductive wires on the front surface of the first cell 31 directly and fills between the adjacent conductive wires 32 on the front surface of the first cell 31; the back adhesive layer 40 contacts with the conductive wires 32 on the back surface of the second cell 31 directly and fills between the adjacent conductive wires 32 on the back surface of the second cell 31.

In other words, in the present disclosure, the two adjacent cells 31 are connected by the metal wire S. In the two adjacent cells 31, the front surface of the first cell 31 is connected with the metal wire S, and the back surface of the second cell 31 is connected with the metal wire S.

The front adhesive layer 20 on the first cell 31 whose front surface is connected with the metal wire S is in direct contact with the metal wire S on the front surface of the first cell 31 and fills between the adjacent conductive wires 32. The back adhesive layer 40 on the second cell 31 whose back surface is connected with the metal wire S is in direct contact with the metal wire S on the back surface of the second cell 31 and fills between the adjacent conductive wires 32 (as shown in FIG. 2).

Consequently, in the solar cell module 100 according to the present disclosure, not only the front adhesive layer 20 can separate the conductive wires 32 on the front surfaces of part of the cells 31 from the outside world, but also the back adhesive layer 40 can separate the conductive wires 32 on the back surfaces of part of the cells 31 from the outside world, so as to further guarantee the photoelectric conversion efficiency of the solar cell module 100.

In some specific embodiments of the present disclosure, for a typical cell with a dimension of 156 mm×156 mm, the solar cell module has a series resistance of 380 to 440 mΩ per 60 cells. The present disclosure is not limited to 60 cells, and there may be 30 cells, 72 cells, etc. When there are 72 cells, the series resistance of the solar cell module is 456 to 528 mΩ, and the electrical performance of the cells is better.

In some specific embodiments of the present disclosure, for a typical cell with a dimension of 156 mm×156 mm, the solar cell module has an open-circuit voltage of 37.5-38.5 V per 60 cells. The present disclosure is not limited to 60 cells, and there may be 30 cells, 72 cells, etc. The short-circuit current is 8.9 to 9.4 A, and is not related to the number of the cells.

In some specific embodiments of the present disclosure, the solar cell module has a fill factor of 0.79 to 0.82, which is independent from the dimension and number of the cells, and can affect the electrical performance of the cells.

In some specific embodiments of the present disclosure, for a typical cell with a dimension of 156 mm×156 mm, the solar cell module has a working voltage of 31.5-32 V per 60 cells. The present disclosure is not limited to 60 cells, and there may be 30 cells, 72 cells, etc. The working current is 8.4 to 8.6 A, and is not related to the number of the cells.

In some specific embodiments of the present disclosure, for a typical cell with a dimension of 156 mm×156 mm, the solar cell module has a conversion efficiency of 16.5-17.4%, and a power of 265-280 W per 60 cells.

A method for manufacturing the solar cell module 100 according to the embodiments of the present disclosure will be illustrated with respect to FIG. 1 to FIG. 3 and FIG. 7 to FIG. 9.

Specifically, the method according to the embodiments of the present disclosure includes the following steps:

providing a cell 31 which includes a cell substrate 311 and a secondary grid line 312 disposed on a front surface of the cell substrate 311;

welding a conductive wire 32 constituted by a metal wire with the secondary grid line 312 to obtain a solar cell, in which the secondary grid line 312 has a width in a welding position with the conductive wire 32 greater than a width thereof in a non-welding position;

superposing the upper cover plate 10, the front adhesive layer 20, the cell array 30, the back adhesive layer 40 and the back plate 50 in sequence, in which the front surface of the cell 31 faces the front adhesive layer 20, and the back surface thereof faces the back adhesive layer 40, and laminating them to obtain the solar cell module 100.

The method includes the steps of preparing a solar array 30, superposing the upper cover plate 10, the front adhesive layer 20, the cell array 30, the back adhesive layer 40 and the back plate 50 in sequence, and laminating them to obtain the solar cell module 100. It can be understood that the method further includes other steps, for example, sealing the gap between the upper cover plate 10 and the back plate 50 by a sealant, and fixing the above components together by a U-shape frame, which are known to those skilled in the art, and thus will be not described in detail herein.

The method includes a step of forming a plurality of conductive wires by a metal wire which extends reciprocally on surfaces of cells 31 and is electrically connected with the surfaces of cells 31, such that the adjacent cells 31 are connected by the plurality of conductive wires to constitute a cell array 30.

Figure 7:
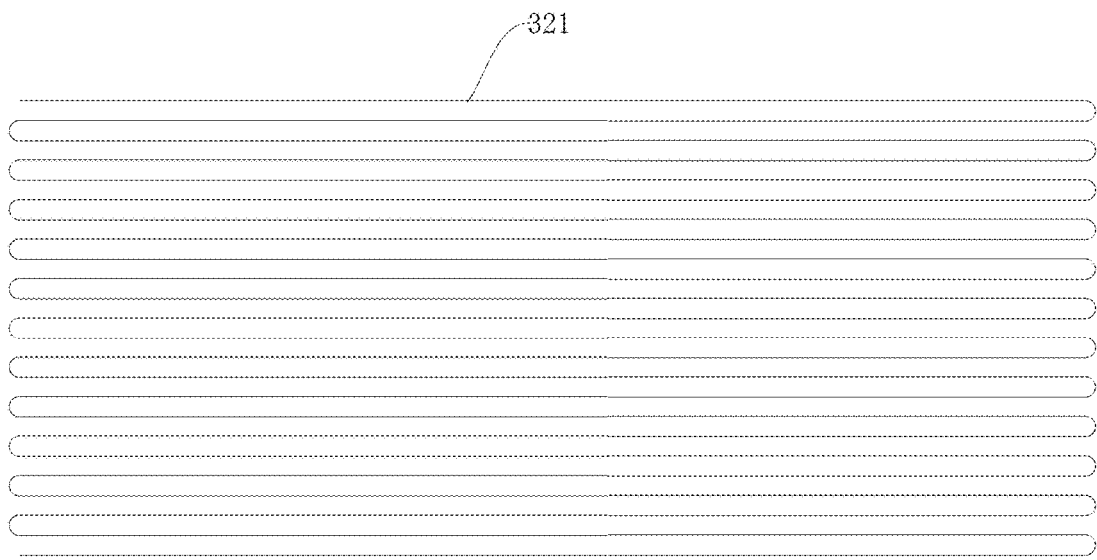
FIG. 7 is a schematic diagram of a metal wire extending reciprocally according to embodiments of the present disclosure.
Figure 8:
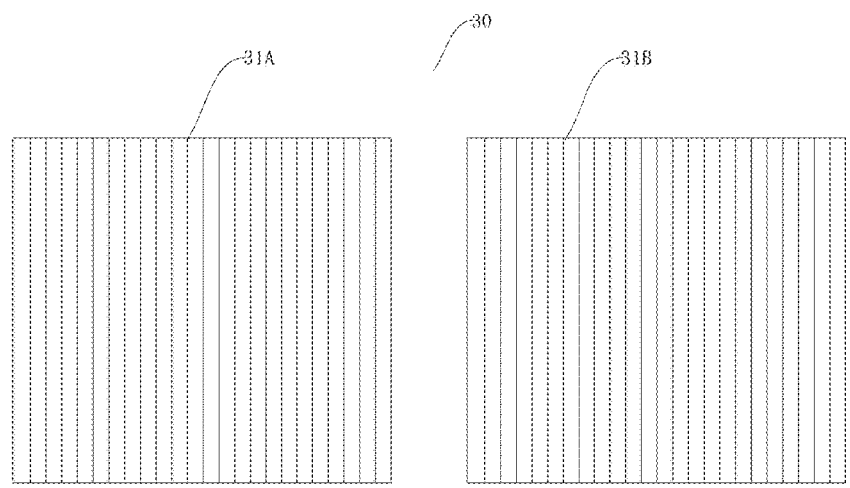
FIG. 8 is a schematic diagram of two cells of a solar cell array according to embodiments of the present disclosure.
Figure 9:
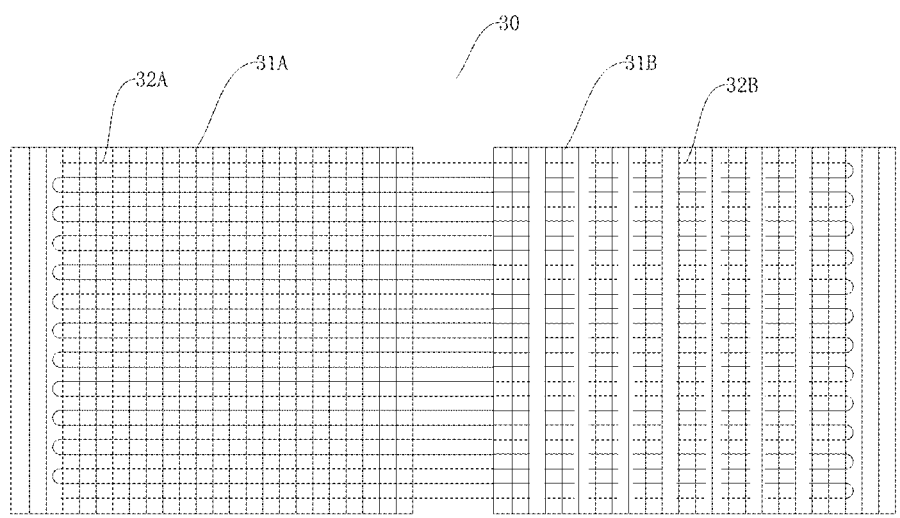
FIG. 9 is a sectional view of a solar cell array formed by connecting, by a metal wire, the two cells according to FIG. 8.

Specifically, as shown in FIG. 7, the metal wire extends reciprocally for 12 times under a strain. As shown in FIG. 8, a first cell 31A and a second cell 31B are prepared. As shown in FIG. 9, a front surface of the first cell 31A is connected with a metal wire, and a back surface of the second cell 31B is connected with the metal wire, such that the cell array 30 is formed. FIG. 9 shows two cells 31. When the cell array 30 has a plurality of cells 31, the metal wire which extends reciprocally connects the front surface of the first cell 31 and the back surface of the second cell 31 adjacent to the first cell 31, i.e. connecting a secondary grid line of the first cell 31 with a back electrode of the second cell 31 by the metal wire. The metal wire extends reciprocally under strain from two clips at two ends thereof. The metal wire can be winded only with the help of two clips, which saves the clips considerably and then reduces the assembling space.

In the embodiment shown in FIG. 9, the adjacent cells are connected in series. As said above, the adjacent cells can be connected in parallel by the metal wire based on practical requirements.

The cell array 30 obtained is superposed with the upper cover plate 10, the front adhesive layer 20, the back adhesive layer 40 and the back plate 50 in sequence, in which a front surface of the cell 31 faces the front adhesive layer 20, a back surface thereof facing the back adhesive layer 40, and laminating them to obtain the solar cell module 100. It can be understood that the metal wire can be bounded or welded with the cell 31 when or before they are laminated.

The front adhesive layer 20 is disposed in direct contact with the conductive wires 32. In the process of laminating, the front adhesive layer 20 melts and fills the gaps between adjacent conductive wires 32. The back adhesive layer 40 is disposed in direct contact with the conductive wires 32. In the process of laminating, the back adhesive layer 40 melts and fills the gaps between adjacent conductive wires 32.

Example 1 is used to illustrate the solar cell module 100 according to the present disclosure and the manufacturing method thereof.

(1) Manufacturing a Metal Wire S

An alloy layer of Sn40%-Bi55%-Pb5% (melting point: 125° C.) is attached to a surface of a copper wire, in which the copper wire has a cross section of 0.04 mm$^2$, and the alloy layer has a thickness of 16 μm. Hence, the metal wire S is obtained.

(2) Manufacturing a Solar Cell Module 100

A POE adhesive layer in 1630×980×0.5 mm is provided (melting point: 65° C.), and a glass plate in 1650×1000×3 mm and a polycrystalline silicon cell 31 in 156×156×0.21 mm are provided correspondingly. The cell 31 has 91 secondary grid lines, each of which substantially runs through the cell 31 in a longitudinal direction, and the distance between the adjacent secondary grid lines is 1.7 mm. The cell 31 has five back electrodes (tin, 1.5 mm in width, 10 μm in thickness) on its back surface. Each back electrode substantially runs through the cell 31 in a longitudinal direction, and the distance between the adjacent back electrodes is 31 mm.

The secondary grid lines 312 are made of silver, and provided with 15 welding portions to be welded with the conductive wires 32. The welding portions have a width of 80 μm and a thickness of 10 μm, and the non-welding portions have a width of 15 μm and a thickness of 5 μm.

60 cells 31 are arranged in a matrix form. In two adjacent cells 31 in a row, a metal wire extends reciprocally between a front surface of a first cell 31 and a back surface of a second cell 31 under strain. The metal wire extends reciprocally under strain from two clips at two ends thereof, so as to form 15 parallel conductive wires. The secondary grid lines of the first cell 31 are welded with the conductive wires and the back electrodes of the second cell 31 are welded with the conductive wires at a welding temperature of 160° C. The distance between parallel adjacent conductive wires is 9.9 mm. 10 cells are connected in series into a row, and six rows of the cells of such kind are connected in series into a cell array via the bus bar.

Then, an upper glass plate, an upper POE adhesive layer, multiple cells arranged in a matrix form and welded with the metal wire, a lower POE adhesive layer and a lower glass plate are superposed sequentially from up to down, in which the front surface of the cell 31 faces the front adhesive layer 20, such that the front adhesive layer 20 contacts with the conductive wires 32 directly; and the back surface of the cell 31 faces the back adhesive layer 40, and finally they are laminated in a laminator, in which the front adhesive layer 20 fills between adjacent conductive wires 32. In such way, a solar cell module A1 is obtained.

Comparison Example 1

The difference of Comparison example 1 and Example 1 lies in that the secondary grid lines 312 are not provided with any welding portion, and have a consistent width in the longitudinal direction, i.e. 15 μm. The conductive wires 32 are welded with the secondary grid lines directly, so as to obtain a solar cell module D1.

Example 2

The difference of Example 2 and Example 1 lies in that the welding portion on the secondary grid line has a width of 160 μm and a thickness of 10 μm; the non-welding portion has a width of 25 μm and a thickness of 5 μm, so as to obtain a solar cell module A2.

Example 3

The difference of Example 3 and Example 1 lies in that the welding portion on the secondary grid line has a width of 240 μm and a thickness of 10 μm; the non-welding portion has a width of 30 μm and a thickness of 5 μm, so as to obtain a solar cell module A3.

Example 4

The difference of Example 4 and Example 2 lies in that the welding portion on the secondary grid line has a thickness of 20 μm; the non-welding portion has a thickness of 8 μm, so as to obtain a solar cell module A4.

Example 5

The difference of Example 5 and Example 2 lies in that the welding portion on the secondary grid line has a thickness of 30 μm; the non-welding portion has a thickness of 10 μm, so as to obtain a solar cell module A5.

Performance Test
(1) Welding-binding force test
(2) The welding-binding force in the solar cell modules A1-A5 and D1 will be tested in the following method respectively:
1. Placing the cell horizontally at a testing position of a tensile tester, and pressing blocks on the cell, in which the pressing blocks are disposed at two sides of the metal wire, such that the cell will not be pulled up during the test;
2. Clamping the metal wire at a pull ring of a tension meter that forms an angle of 45° with the cell;
3. Actuating the tension meter, such that the tension meter moves uniformly along a vertical direction, pulls up the metal wire from the surface of the cell and records the pull data tested, in which the data is averaged to obtain the pull data of the metal wire.
(3) Photoelectric conversion efficiency test According to the method disclosed in IEC904-1, the solar cell modules manufactured in the above examples and the comparison example are tested with a single flash simulator under standard test conditions (STC): 1000 W/m² of light intensity, AM1.5 spectrum, and 25° C. The photoelectric conversion efficiency of each cell is recorded. The testing result is shown in Table 1.

TABLE 1

| Solar cell module | A1 | D1 | A2 | A3 | A4 | A5 |
|---|---|---|---|---|---|---|
| Welding-binding force (N) | 0.22 | <0.1 | 0.35 | 0.38 | 0.41 | 0.46 |
| Photoelectric conversion efficiency (%) | 16.4 | 15.1 | 16.6 | 16.7 | 16.7 | 16.8 |

It can be indicated from FIG. 1 that by comparison between A1-A5 and D1, the welding portions whose projection is broadened, the solar cell module according to the embodiments of the present disclosure has higher welding-binding force, better welding performance, and obtains relatively high photoelectric conversion efficiency.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," or "some examples" means that a particular feature, structure, material, or characteristic described in connection with the embodiment or example is included in at least one embodiment or example of the present disclosure. Thus, these terms throughout this specification do not necessarily refer to the same embodiment or example of the present disclosure. Furthermore, the particular features, structures, materials, or characteristics may be combined in any suitable manner in one or more embodiments or examples.

Although embodiments of the present disclosure have been shown and described, it would be appreciated by those skilled in the art that changes, modifications, alternatives and variations can be made in the embodiments without departing from the scope of the present disclosure.

What is claimed is:
1. A solar cell unit, comprising:
a first cell including a first cell substrate and a plurality of first secondary grid lines disposed in parallel on a front surface of the first cell substrate;
a second cell adjacent to the first cell, the second cell comprising a second cell substrate and a plurality of second secondary grid lines disposed in parallel on a back surface of the second cell substrate;
a conductive wire intersecting and weldingly connected with the plurality of first secondary grid lines by a welding layer, where:
the welding layer is disposed on at least a portion of the conductive wire around an entire circumference of the at least portion of the conductive wire,
the plurality of first secondary grid lines have a width in a welding position with the conductive wire greater than a width thereof in a non-welding posi- tion, and the plurality of first secondary grid lines have a height in a welding position with the conductive wire greater than a height thereof in a non-welding position, thereby stabilizing connections with the conductive wire and enhancing peel strength of the conductive wire;

wherein the conductive wire comprises a metal wire, and the metal wire extends reciprocally between the front surface of the first cell and the back surface of the second cell; and wherein the first secondary grid lines comprise a middle secondary grid line disposed at a middle portion of the first cell and an edge secondary grid line disposed adjacent to an edge of the first cell, a width of the edge secondary grid line is larger than a width of the middle secondary grid lines, and the edge secondary grid line comprising a plurality of welding positions and a plurality of non-welding positions, wherein each welding position of the edge secondary grid line has a length longer than a length of each non-welding position between adjacent welding positions of the edge secondary grid line, wherein the length of each welding position of the edge secondary grid line is parallel along a longitudinal direction of the first secondary grid lines and the length of the non-welding position of the edge secondary grid line is parallel along the longitudinal direction of the first the secondary grid lines.

2. The solar cell unit according to claim 1, wherein the plurality of first secondary grid lines disposed in parallel has a width in the welding position greater than or equal to a diameter or width of the conductive wire.

3. The solar cell unit according to claim 1, wherein the plurality of first secondary grid lines has a width of 0.08-0.24 mm in the welding position, and a width of 0.015-0.03 mm in the non-welding position; both the width of the plurality of first secondary grid lines in the welding position and the width of the plurality of first secondary grid lines in the non-welding position are a maximum size in a direction orthogonal to a longitudinal direction of the plurality of first secondary grid lines.

4. A solar cell array, comprising a plurality of solar cell units of claim 1.

5. The solar cell array according to claim 4, wherein a back electrode is disposed on a back surface of the first cell substrate, and the metal wire is weldingly connected with the back electrode of the second cell.

6. The solar cell array according to claim 4, wherein there is only one metal wire in each solar cell unit.

7. The solar cell array according to claim 4, wherein two adjacent conductive wires form a U-shape structure or a V-shape structure.

8. The solar cell array according to claim 4, wherein the solar cell units are arranged in an n×m matrix form, n representing a column, and m representing a row;

in a row of solar cell units, the metal wire extends reciprocally between a surface of a first solar cell unit of the row and a surface of a second solar cell unit of the row adjacent to the first solar cell unit of the row;

in two adjacent rows of solar cell units, the metal wire extends reciprocally between a surface of a solar cell unit in a $a^{th}$ row and a surface of a solar cell unit in a $(a+1)^{th}$ row; and m−1>a>1.

9. The solar cell array according to claim 8, wherein in two adjacent rows of solar cell units, the metal wire extends reciprocally between a surface of a solar cell unit at an end of the $a^{th}$ row and a surface of a solar cell unit at an end of the $(a+1)^{th}$ row, the end of the $a^{th}$ row and the end of the $(a+1)^{th}$ row located at the same side of the matrix form.

10. The solar cell array according to claim 9, wherein in a row of solar cell units, the metal wire extends reciprocally between a front surface of a first solar cell unit of the row and a back surface of a second solar cell unit of the row adjacent to the first solar cell unit of the row;

in two adjacent rows of solar cell units, the metal wire extends reciprocally between a front surface of the solar cell unit at the end of the $a^{th}$ row and a back surface of the solar cell unit at the end of the $(a+1)^{th}$ row, to connect the two adjacent rows of solar cell units in series.

11. The solar cell array according to claim 8, wherein one metal wire extends reciprocally between adjacent solar cell units in a row; and another metal wire extends reciprocally between solar cell units in adjacent rows.

12. The solar cell array according to claim 4, wherein the metal wire is coated with the welding layer, and the welding layer contains Sn, and at least one of Bi, In, Ag, Sb, Pb and Zn.

13. The solar cell array according to claim 12, wherein the welding layer contains Sn, Bi, and at least one of In, Ag, Sb, Pb and Zn.

14. A solar cell module, comprising an upper cover plate, a front adhesive layer, a solar cell array of claim 4, a back adhesive layer and a back plate superposed in sequence.

15. The solar cell unit according to claim 1, wherein the conductive wire and the first cell substrate are connected only through the welding positions of the plurality of first secondary grid lines.

* * * * *